(12) United States Patent
Yamada et al.

(10) Patent No.: US 12,119,793 B2
(45) Date of Patent: Oct. 15, 2024

(54) POWER AMPLIFIER MODULE

(71) Applicant: Murata Manufacturing Co., Ltd., Kyoto (JP)

(72) Inventors: Takashi Yamada, Kyoto (JP); Satoshi Tanaka, Kyoto (JP); Yasuhisa Yamamoto, Kyoto (JP)

(73) Assignee: MURATA MANUFACTURING CO., LTD, Kyoto (JP)

( * ) Notice: Subject to any disclaimer, the term of this patent is extended or adjusted under 35 U.S.C. 154(b) by 688 days.

(21) Appl. No.: 17/193,494

(22) Filed: Mar. 5, 2021

(65) Prior Publication Data
US 2021/0281226 A1 Sep. 9, 2021

(30) Foreign Application Priority Data

Mar. 6, 2020 (JP) .................................. 2020-039065

(51) Int. Cl.
*H03F 3/21* (2006.01)
*H01L 23/00* (2006.01)
(Continued)

(52) U.S. Cl.
CPC .......... *H03F 3/21* (2013.01); *H01L 23/49822* (2013.01); *H01L 23/642* (2013.01);
(Continued)

(58) Field of Classification Search
CPC ........ H03F 3/21; H03F 1/56; H03F 2200/387; H03F 2200/447; H03F 2200/451; H03F 1/565; H03F 3/211; H03F 3/195; H03F 3/602; H03F 2201/3215; H01L 23/49822; H01L 23/642; H01L 23/645; H01L 24/16; H01L 25/16; H01L 2224/16014;
(Continued)

(56) References Cited

U.S. PATENT DOCUMENTS 8,983,406 B2 3/2015 Zhang et al.
9,467,940 B2 10/2016 Zhang et al.
(Continued)

FOREIGN PATENT DOCUMENTS

JP 2004-080754 A 3/2004
JP 2017-084898 A 5/2017

*Primary Examiner* — Andrea Lindgren Baltzell
*Assistant Examiner* — Khiem D Nguyen
(74) *Attorney, Agent, or Firm* — Pearne & Gordon LLP

(57) ABSTRACT

A power amplifier module includes a substrate, an amplifier circuit including a plurality of transistors to be mounted on the substrate and a bump connected to the plurality of transistors, a harmonic termination circuit and an output matching circuit that are disposed in or on the substrate and configured to be electrically connected to the amplifier circuit, a connection pad disposed on the substrate and configured to be connected to the bump, and a plurality of connection wiring lines branching from the connection pad. The plurality of connection wiring lines include at least a first connection wiring line that connects the connection pad and the harmonic termination circuit to each other, a second connection wiring line that connects the connection pad and the output matching circuit to each other, and a third connection wiring line that connects the connection pad and an external power supply to each other.

20 Claims, 4 Drawing Sheets

(51) Int. Cl.
*H01L 23/498* (2006.01)
*H01L 23/64* (2006.01)
*H01L 25/16* (2023.01)
*H03F 1/56* (2006.01)

(52) U.S. Cl.
CPC ............ *H01L 23/645* (2013.01); *H01L 24/16* (2013.01); *H01L 25/16* (2013.01); *H03F 1/56* (2013.01); *H01L 2224/16014* (2013.01); *H01L 2224/16227* (2013.01); *H03F 2200/387* (2013.01); *H03F 2200/447* (2013.01)

(58) Field of Classification Search
CPC ........... H01L 2224/16227; H01L 24/13; H01L 2223/6627; H01L 2223/6644; H01L 2223/665; H01L 2223/6655; H01L 2224/13013; H01L 2224/13014; H01L 2224/131; H01L 2224/13147; H01L 2924/15192; H01L 2924/19041; H01L 2924/19042; H01L 2924/19105; H01L 23/66
USPC ................................... 330/297, 307
See application file for complete search history.

(56) References Cited

U.S. PATENT DOCUMENTS

| | | |
|---|---|---|
| 2004/0017260 A1 | 1/2004 | Cho et al. |
| 2014/0312977 A1* | 10/2014 | Kaczman .............. H03F 1/0222 330/295 |
| 2017/0118841 A1 | 4/2017 | No |

* cited by examiner

POWER AMPLIFIER MODULE

CROSS REFERENCE TO RELATED APPLICATION

This application claims priority from Japanese Patent Application No. 2020-039065 filed on Mar. 6, 2020. The content of this application is incorporated herein by reference in its entirety.

BACKGROUND

The present disclosure relates to a power amplifier module. A mobile communication terminal device, such as a mobile phone or a smartphone includes a power amplifier circuit having a transistor. For example, U.S. Pat. No. 8,983,406 describes a power amplifier module including a power amplifier circuit, an output matching network, and a harmonic termination circuit.

For example, the fifth-generation communication system requires an increase in the output level of a power amplifier circuit. With the increase in the output level of a power amplifier circuit, measures against harmonics and measures against heat generated by the power amplifier circuit are both becoming increasingly important. In the power amplifier module described in U.S. Pat. No. 8,983,406, it may be difficult to take measures against heat generated by the power amplifier circuit.

BRIEF SUMMARY

The present disclosure provides a power amplifier module that enables good dissipation of heat generated by a power amplifier circuit.

According to embodiments of the present disclosure, a power amplifier module includes a substrate, an amplifier circuit including a plurality of transistors to be mounted on the substrate, and a bump connected to the plurality of transistors, a harmonic termination circuit, an output matching circuit, the harmonic termination circuit and the output matching circuit being disposed in or on the substrate and configured to be electrically connected to the amplifier circuit, a connection pad disposed on the substrate and configured to be connected to the bump, and a plurality of connection wiring lines branching from the connection pad. The plurality of connection wiring lines include at least a first connection wiring line that connects the connection pad and the harmonic termination circuit to each other, a second connection wiring line that connects the connection pad and the output matching circuit to each other, and a third connection wiring line that connects the connection pad and an external power supply to each other.

A power amplifier module according to embodiments of the present disclosure enables good dissipation of heat generated by a power amplifier circuit.

Other features, elements, characteristics and advantages of the present disclosure will become more apparent from the following detailed description of embodiments of the present disclosure with reference to the attached drawings.

DETAILED DESCRIPTION

The following describes power amplifier modules according to embodiments of the present disclosure in detail with reference to the drawings. The present disclosure is not limited by the embodiments. It is to be understood that the embodiments are illustrative and components presented in different embodiments may be partially replaced or combined. Features common to a first embodiment will not be described in a second embodiment and the subsequent embodiments, and only differences will be described. Features common to a first embodiment will not be described in a second embodiment and the subsequent embodiments, and only differences will be described. In particular, similar operations and effects achieved with similar configurations will not be described again in the individual embodiments.

First Embodiment

Figure 1:
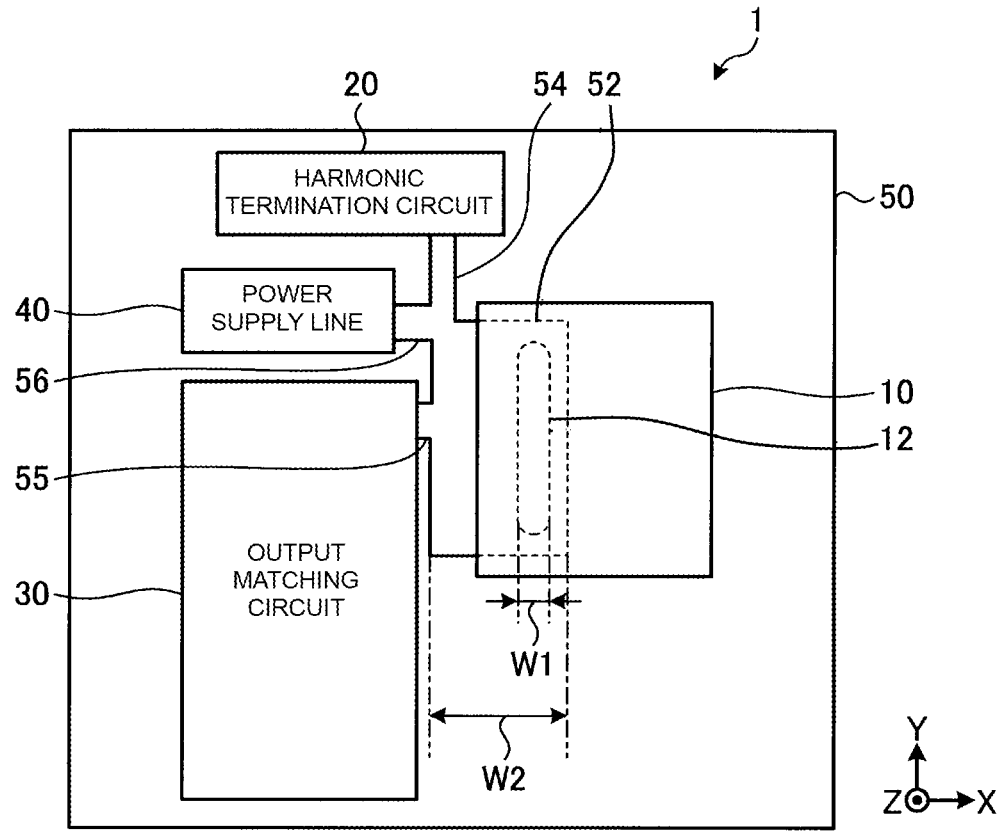
FIG. 1 is a schematic plan view of a power amplifier module according to a first embodiment.
Figure 2:
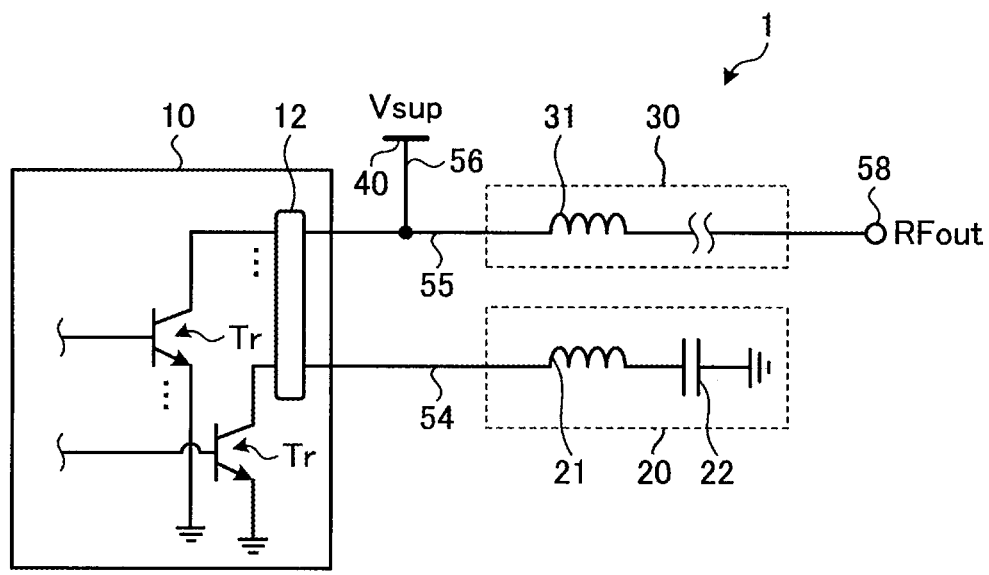
FIG. 2 is an equivalent circuit diagram schematically illustrating the power amplifier module according to the first embodiment.

FIG. 1 is a schematic plan view of a power amplifier module 1 according to a first embodiment. FIG. 2 is an equivalent circuit diagram schematically illustrating the power amplifier module 1 according to the first embodiment. The power amplifier module 1 is included in a mobile communication device, examples of which include a mobile phone device and a smartphone, and is usable to transmit or receive various signals, such as audio and data signals to or from a base station.

As illustrated in FIG. 1, the power amplifier module 1 includes a substrate 50, an amplifier circuit 10, a harmonic termination circuit 20, an output matching circuit 30, a power supply line 40, a connection pad 52, and a plurality of connection wiring lines (a first connection wiring line 54, a second connection wiring line 55, and a third connection wiring line 56).

The substrate 50 is a substantially flat-plate-shaped insulating substrate and is, for example, a printed circuit board made of glass epoxy or the like, a ceramic substrate, such as an alumina substrate, a flexible substrate made of polyimide or the like, or a liquid crystal polymer substrate.

The amplifier circuit 10 is disposed on a principal surface of the substrate 50. As illustrated in FIG. 2, the amplifier circuit 10 includes a plurality of transistors Tr and a bump 12 connected to the plurality of transistors Tr. In this embodiment, each of the transistors Tr is a bipolar transistor. Examples of the bipolar transistor include a heterojunction bipolar transistor (HBT). The plurality of transistors Tr have collectors connected to the common bump 12. Alternatively, the transistors Tr may be, for example, field-effect transistors (FETs). Each of the transistors Tr may be a multi-finger transistor having a plurality of unit transistors (also referred to as fingers) electrically connected in parallel to each other.

As illustrated in FIG. 1, the bump 12 is connected to the connection pad 52 on the substrate 50. In one example, the bump 12 has a substantially elliptical shape or a substantially rectangular shape extending in the Y direction in plan view. The bump 12 is, for example, a Cu pillar bump formed by electroplating. However, the bump 12 may be, for example, a solder bump, a stud bump, or a gold bump.

In the following description, the X direction and the Y direction are parallel to the principal surface of the substrate 50, and the Y direction is orthogonal to the X direction. The Z direction is orthogonal to the X direction and the Y direction. The Z direction is a direction normal to the principal surface of the substrate 50. As disclosed herein, the term "plan view" refers to a view taken in the Z direction.

The connection pad 52 is disposed on the principal surface of the substrate 50. The connection pad 52 is a conductive layer formed of a metal material having conductivity, such as copper, silver, gold, or an alloy material containing the metals described above. The connection pad 52 has a substantially rectangular shape in plan view. The area of the connection pad 52 is larger than the area of the bump 12 in plan view. That is, the length of the connection pad 52 in the Y direction is longer than the length of the bump 12 in the Y direction. The connection pad 52 has a length W2 in the X direction that is longer than a length W1 of the bump 12 in the X direction. The ratio of the length W2 to the length W1 satisfies Expression (1) below. This ensures that the bump 12 and the connection pad 52 are electrically connected to each other.

$$W2/W1 \geq 1.06 \tag{1}$$

The connection pad 52 has a portion that overlaps the amplifier circuit 10, and a portion that does not overlap the amplifier circuit 10 and that projects outward from an outer periphery of the amplifier circuit 10. However, this is not limiting, and the connection pad 52 may entirely overlap the amplifier circuit 10.

The harmonic termination circuit 20 and the output matching circuit 30 are disposed on the substrate 50. More specifically, the harmonic termination circuit 20 and the output matching circuit 30 are formed outside a chip component that forms the amplifier circuit 10. In the example illustrated in FIG. 1, the harmonic termination circuit 20 is disposed so as to be shifted more in the Y direction than the amplifier circuit 10 and the connection pad 52. The output matching circuit 30 is arranged adjacent to the amplifier circuit 10 and the connection pad 52 in the X direction (the minus X direction).

The power amplifier module 1 further includes, as a plurality of connection wiring lines branching from the connection pad 52, the first connection wiring line 54, the second connection wiring line 55, and the third connection wiring line 56. In FIG. 1, three connection wiring lines are illustrated, for ease of understanding, but not limitation. Four or more connection wiring lines may be connected to the connection pad 52 in accordance with the number of components to be mounted on the substrate 50 and electrically connected to the amplifier circuit 10.

The first connection wiring line 54 connects the connection pad 52 and the harmonic termination circuit 20 to each other. The first connection wiring line 54 extends from the connection pad 52 in the Y direction and is connected to the harmonic termination circuit 20. Accordingly, the harmonic termination circuit 20 is electrically connected to the amplifier circuit 10 via the first connection wiring line 54, the connection pad 52, and the bump 12.

The second connection wiring line 55 connects the connection pad 52 and the output matching circuit 30 to each other. Specifically, the second connection wiring line 55 extends from the connection pad 52 in the X direction (the minus X direction) and is connected to the output matching circuit 30. Accordingly, the output matching circuit 30 is electrically connected to the amplifier circuit 10 via the second connection wiring line 55, the connection pad 52, and the bump 12.

The third connection wiring line 56 is connected to the power supply line 40. The power supply line 40 is disposed between the harmonic termination circuit 20 and the output matching circuit 30 in the Y direction. The power supply line 40 is a wiring line along which a power supply signal Vsup (see FIG. 2) is supplied from an external power supply. The third connection wiring line 56 extends from the connection pad 52 in the X direction (the minus X direction) and connects the connection pad 52 and the external power supply to each other. Alternatively, in place of the power supply line 40, a terminal or a connector may be connected to the third connection wiring line 56.

As illustrated in FIG. 2, the amplifier circuit 10 amplifies a high-frequency signal in a predetermined frequency range that is input to an input terminal (base), and outputs the amplified signal to an external antenna (not illustrated) from an output terminal 58 via the output matching circuit 30.

The harmonic termination circuit 20 is disposed between the bump 12 of the amplifier circuit 10 and a reference potential (for example, ground). The harmonic termination circuit 20 is formed by an LC circuit including an inductor 21 and a capacitor 22, which is connected in series with the first connection wiring line 54. In this embodiment, the first connection wiring line 54, the inductor 21, and the capacitor 22 are connected in this order. That is, the inductor 21 is disposed at a position closer to the amplifier circuit 10 than the capacitor 22. The harmonic termination circuit 20 is configured to allow a harmonic signal at an nth harmonic (n is an integer greater than or equal to 2) to pass through ground. Accordingly, a high-frequency signal with the nth-order harmonic suppressed is output from the output terminal 58 as an output signal RFout. The order of connection may be changed such that the capacitor 22 and the inductor 21 are connected in this order.

The output matching circuit 30 is disposed between the bump 12 of the amplifier circuit 10 and the output terminal 58. The output matching circuit 30 includes an inductor 31 connected in series with the second connection wiring line 55. The output matching circuit 30 is a circuit that matches the output impedance of the amplifier circuit 10 and the impedance of a subsequent circuit on the output terminal 58 side.

As described above, the power amplifier module 1 according to this embodiment includes the substrate 50, the amplifier circuit 10, the harmonic termination circuit 20, the output matching circuit 30, the connection pad 52, and the plurality of connection wiring lines (the first connection wiring line 54, the second connection wiring line 55, and the third connection wiring line 56). The amplifier circuit 10 includes the plurality of transistors Tr to be mounted on the substrate 50, and the bump 12 connected to the plurality of transistors Tr. The harmonic termination circuit 20 and the output matching circuit 30 are disposed on the substrate 50 and are electrically connected to the amplifier circuit 10. The connection pad 52 is disposed on the substrate 50 and is connected to the bump 12. The plurality of connection wiring lines branch from the connection pad 52. The plurality of connection wiring lines include at least the first connection wiring line 54, which connects the connection pad 52 and the harmonic termination circuit 20 to each other, the second connection wiring line 55, which connects the connection pad 52 and the output matching circuit 30 to each other, and the third connection wiring line 56, which connects the connection pad 52 and the external power supply to each other.

With this configuration, in the power amplifier module 1, the harmonic termination circuit 20, the output matching circuit 30, and the power supply line 40 are electrically connected to the common connection pad 52 and the common bump 12 via different connection wiring lines. In this embodiment, accordingly, the heat dissipation area of the connection pad 52 and the bump 12 is increased, compared with a case where the harmonic termination circuit 20, the output matching circuit 30, and the power supply line 40 are provided with separate connection pads and bumps. The heat generated by the plurality of transistors Tr of the amplifier circuit 10 is dissipated toward the substrate 50 via the bump 12 and the connection pad 52.

The inductor 31 of the output matching circuit 30 and the inductor 21 of the harmonic termination circuit 20 are also included in a dissipation path of heat generated from the collectors of the transistors Tr. The inductor 21 of the harmonic termination circuit 20 is disposed at a position closer to the amplifier circuit 10 than the capacitor 22. Accordingly, the power amplifier module 1 further increases the heat dissipation area, thus making it possible to effectively dissipate heat. Furthermore, the power amplifier module 1 does not require any electrode or component for heat dissipation, and thus enables good dissipation of heat generated by the amplifier circuit 10 while achieving a reduction in size.

The arrangement of the harmonic termination circuit 20, the output matching circuit 30, and the power supply line 40 illustrated in FIG. 1 may be changed, if necessary. In addition, the arrangement and the extending direction of the first connection wiring line 54, the second connection wiring line 55, and the third connection wiring line 56 may be changed, if necessary, in accordance with the arrangement of the harmonic termination circuit 20, the output matching circuit 30, and the power supply line 40.

First Modification

Figure 3:
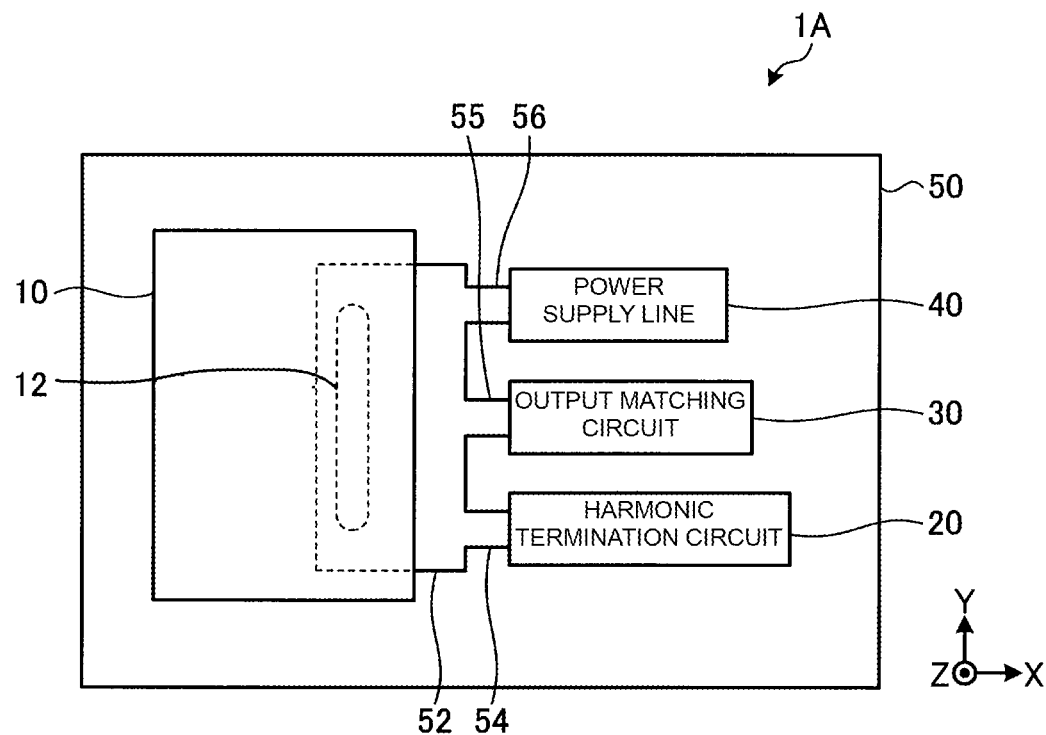
FIG. 3 is a schematic plan view of a power amplifier module according to a first modification of the first embodiment.

FIG. 3 is a schematic plan view of a power amplifier module 1A according to a first modification of the first embodiment. As illustrated in FIG. 3, the power amplifier module 1A according to the first modification is different from the power amplifier module 1 according to the first embodiment described above in the arrangement of the harmonic termination circuit 20, the output matching circuit 30, and the power supply line 40.

Specifically, the harmonic termination circuit 20, the output matching circuit 30, and the power supply line 40 are arranged adjacent to the amplifier circuit 10 and the connection pad 52 in the X direction. The harmonic termination circuit 20, the output matching circuit 30, and the power supply line 40 are arranged in this order in the Y direction. The first connection wiring line 54, the second connection wiring line 55, and the third connection wiring line 56 are also arranged in this order in the Y direction and extend from the connection pad 52 in the X direction.

As described above, even when the arrangement of the harmonic termination circuit 20, the output matching circuit 30, and the power supply line 40 is changed, as in the first embodiment described above, the harmonic termination circuit 20, the output matching circuit 30, and the power supply line 40 are electrically connected to the common connection pad 52 and the common bump 12 via the respective connection wiring lines.

Second Embodiment

Figure 4:
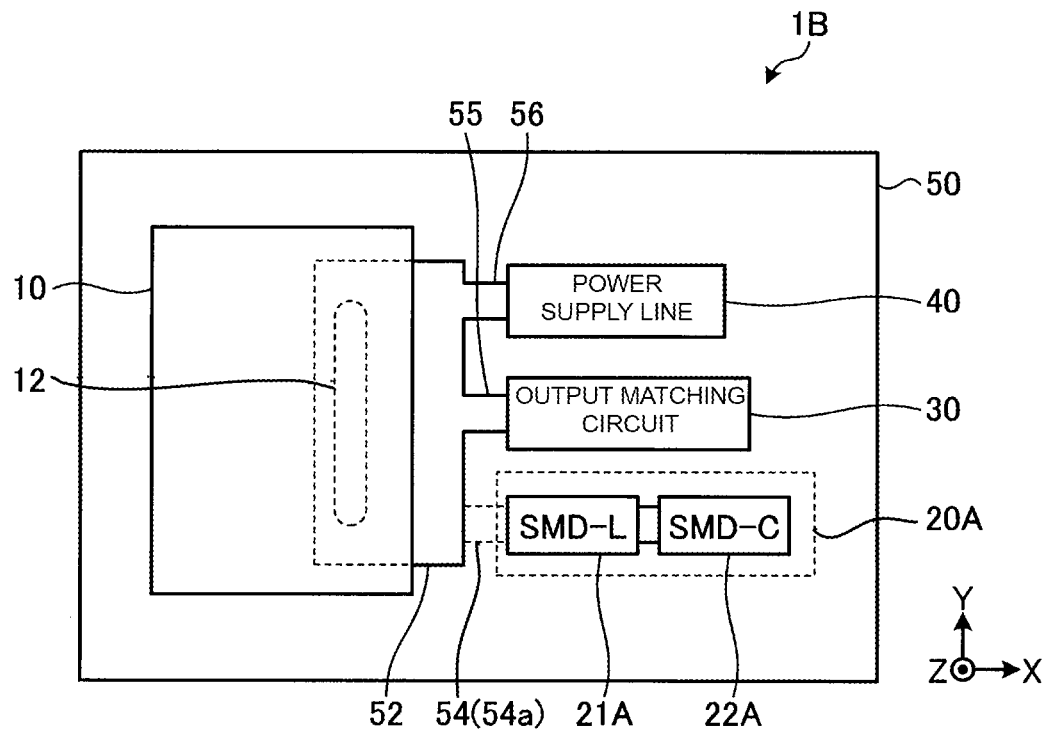
FIG. 4 is a schematic plan view of a power amplifier module according to a second embodiment.

FIG. 4 is a schematic plan view of a power amplifier module 1B according to a second embodiment. In the second embodiment, unlike the first embodiment described above, an inductor 21A and a capacitor 22A of a harmonic termination circuit 20A are chip components mounted on the substrate 50.

As illustrated in FIG. 4, in the power amplifier module 1B, the inductor 21A and the capacitor 22A are connected in series with the first connection wiring line 54 in this order. The inductor 21A and the capacitor 22A are surface-mount chip components. This facilitates the mounting of the inductor 21A and the capacitor 22A on the principal surface of the substrate 50. In this embodiment, furthermore, appropriate chip components can be selected in accordance with the inductance value of the inductor 21A and the capacitor value of the capacitor 22A. This facilitates a design change compared with a case where the inductor 21A and the capacitor 22A are formed using wiring lines, electrodes, or the like on the substrate 50.

At least a portion of the first connection wiring line 54 includes an intermediate wiring layer 54a disposed in an inner layer of the substrate 50. The intermediate wiring layer 54a has an end connected to the connection pad 52 through a via connecting layers. The intermediate wiring layer 54a has another end connected to the first connection wiring line 54 on the principal surface of the substrate 50 through a via connecting layers.

The intermediate wiring layer 54a improves the flexibility of wiring of lines. As a result, the flexibility of arrangement of the circuits, such as the harmonic termination circuit 20A and the output matching circuit 30, can also be improved. The second connection wiring line 55 and the third connection wiring line 56 are disposed on the principal surface of the substrate 50 in such a manner as to lie in the same layer as that of the connection pad 52. However, this is not limiting, and at least portions of the second connection wiring line 55 and the third connection wiring line 56 may include an intermediate wiring layer disposed in an inner layer of the substrate 50.

The elements in the second embodiment may be combined with the elements in the first embodiment described above. That is, in the power amplifier module 1B according to the second embodiment, the arrangement of the amplifier circuit 10, the harmonic termination circuit 20A, and the output matching circuit 30 may be changed, if necessary, and may be, for example, that according to the first embodiment illustrated in FIG. 1.

Third Embodiment

Figure 5:
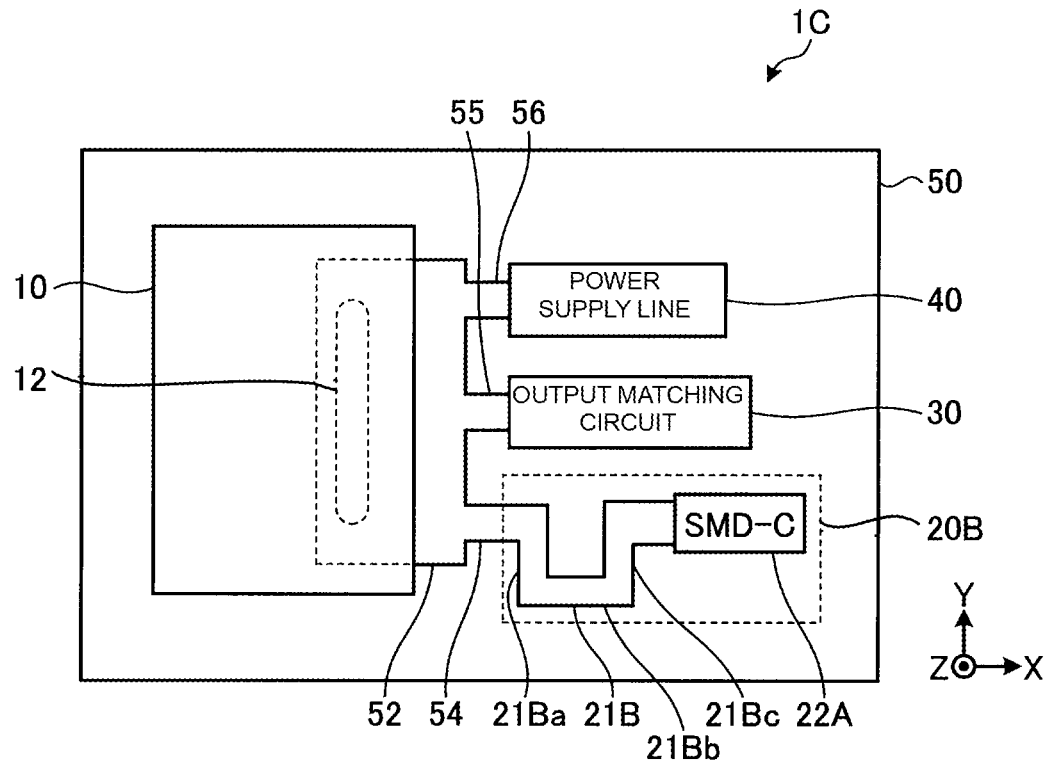
FIG. 5 is a schematic plan view of a power amplifier module according to a third embodiment.

FIG. 5 is a schematic plan view of a power amplifier module 1C according to a third embodiment. In the third embodiment, unlike the first and second embodiments described above, an inductor 21B of a harmonic termination circuit 20B is formed by a wiring line disposed on the substrate 50, and the capacitor 22A is a chip component mounted on the substrate 50.

Specifically, as illustrated in FIG. 5, in the power amplifier module 1C, the inductor 21B includes a first sub-wiring line 21Ba, a second sub-wiring line 21Bb, and a third sub-wiring line 21Bc. The first sub-wiring line 21Ba is connected to the first connection wiring line 54 and extends in the Y direction. The second sub-wiring line 21Bb is connected to the first sub-wiring line 21Ba and extends in the X direction. The third sub-wiring line 21Bc is connected to the second sub-wiring line 21Bb and extends in the Y direction. In this manner, the inductor 21B has a plurality of sub-wiring lines connected in a bent state. The inductor 21B can have a longer wiring line length than an inductor formed in a straight line and can have a predetermined inductance value.

In this embodiment, the sub-wiring lines 21Ba, 21Bb, and 21Bc of the inductor 21B also function as a dissipation path, thus making it possible to effectively dissipate heat from the amplifier circuit 10. In addition, the manufacturing cost can be reduced, compared with a case where the inductor 21B is implemented as a chip component. As described above, the inductor 21B has an inductance value for an nth-order harmonic and can thus be reduced in size even when the inductor 21B is formed by a wiring line. The wiring pattern of the inductor 21B is not limited to that in the example illustrated in FIG. 5 and may be changed, if necessary, to a spiral or meander pattern or any other pattern. The inductor 21B may be formed in an inner layer (not illustrated) of the substrate 50 such that the inductor 21B appears on the surface layer of the substrate 50 and is connected to the capacitor 22A.

The elements in the third embodiment may be combined with the elements in the first embodiment described above. That is, in the power amplifier module 1C according to the third embodiment, the arrangement of the amplifier circuit 10, the harmonic termination circuit 20B, and the output matching circuit 30 may be changed, if necessary, and, may be, for example, that according to the first embodiment illustrated in FIG. 1.

Fourth Embodiment

Figure 6:
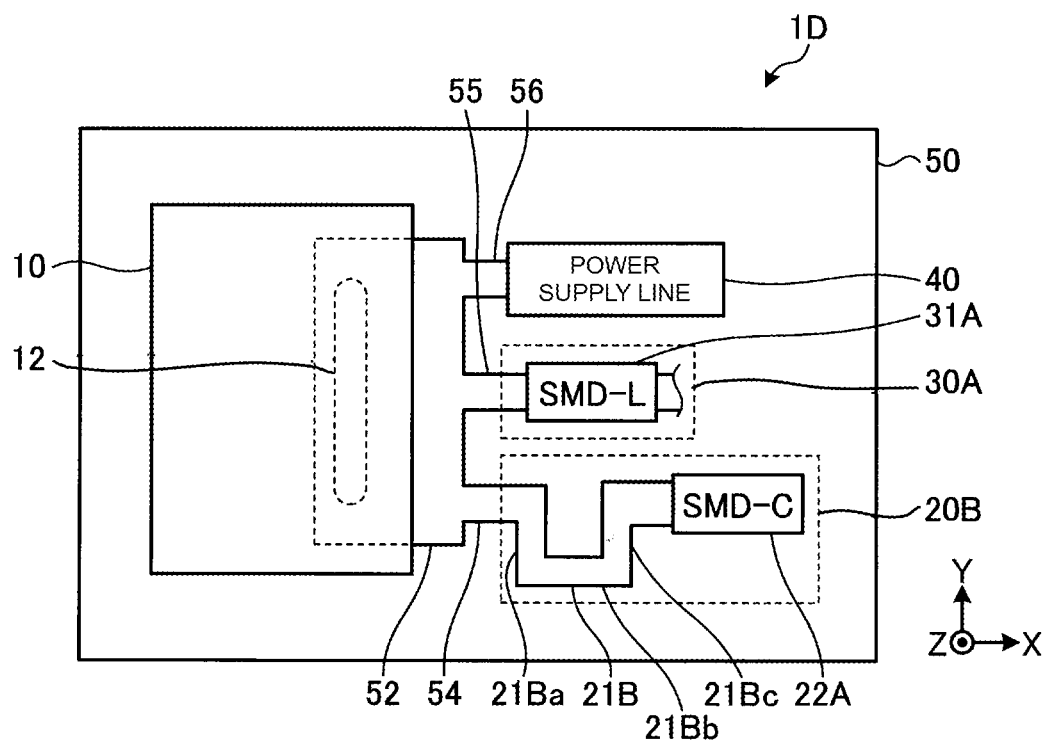
FIG. 6 is a schematic plan view of a power amplifier module according to a fourth embodiment.

FIG. 6 is a schematic plan view of a power amplifier module 1D according to a fourth embodiment. In the fourth embodiment, unlike the first to third embodiments described above, an inductor 31A of an output matching circuit 30A is a chip component mounted on the substrate 50.

As illustrated in FIG. 6, in the power amplifier module 1D, the inductor 31A of the output matching circuit 30A is connected in series with the second connection wiring line 55. The inductor 31A is implemented as a surface-mount chip component. On the other hand, as in the third embodiment, the inductor 21B of the harmonic termination circuit 20B is formed by a plurality of sub-wiring lines. That is, the inductor 31A of the output matching circuit 30A having a larger inductance value is implemented as a surface-mount chip component, whereas the inductor 21B of the harmonic termination circuit 20B having a smaller inductance value is formed by a wiring line. Accordingly, the power amplifier module 1D can suppress a reduction in heat dissipation characteristic while achieving a reduction in size.

The elements in the fourth embodiment may be combined with the elements in the first to third embodiments described above. That is, the power amplifier module 1D according to the fourth embodiment may include, in place of the harmonic termination circuit 20B, the harmonic termination circuit 20 having any other configuration, such as the harmonic termination circuit 20A illustrated in FIG. 4.

Fifth Embodiment

Figure 7:
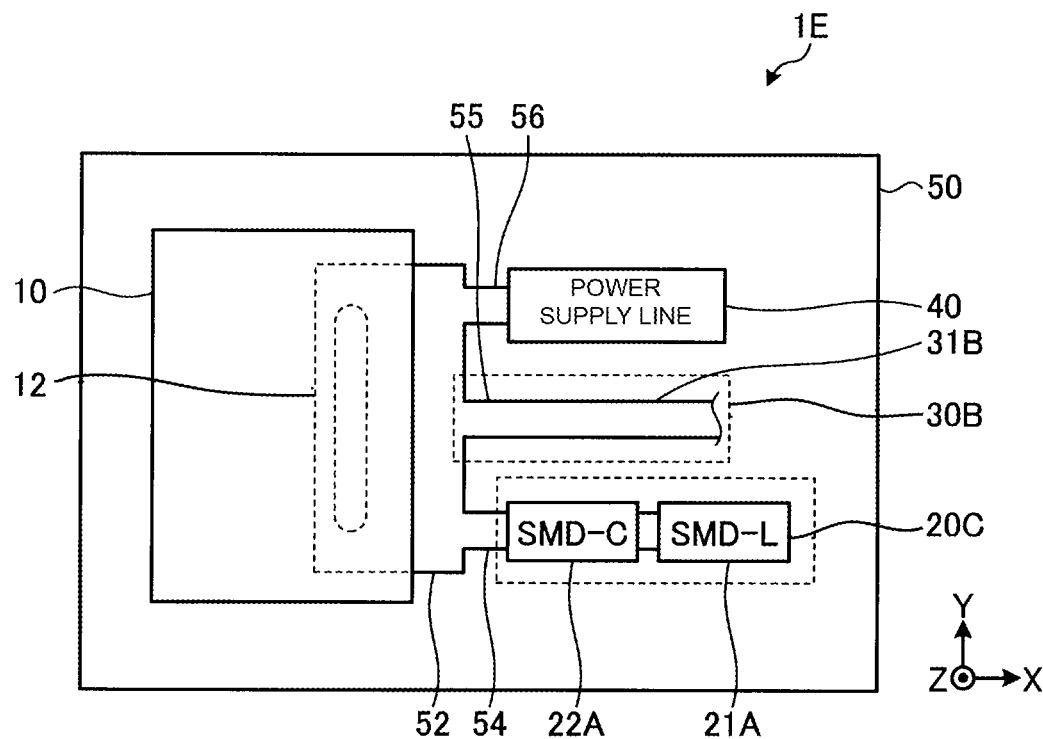
FIG. 7 is a schematic plan view of a power amplifier module according to a fifth embodiment.

FIG. 7 is a schematic plan view of a power amplifier module 1E according to a fifth embodiment. In the fifth embodiment, unlike the first to fourth embodiments described above, an inductor 31B of an output matching circuit 30B is formed by a wiring line disposed on the substrate 50.

As illustrated in FIG. 7, in the power amplifier module 1E, the inductor 31B of the output matching circuit 30B is formed by a wiring line connected to the second connection wiring line 55 and extending in a straight line in the X direction. In FIG. 7, the inductor 31B has substantially the same width as the second connection wiring line 55 and is disposed as a common wiring line. In this embodiment, accordingly, the heat dissipation effect of the inductor 31B of the output matching circuit 30B can be improved.

The inductor 31B is not limited to a straight-line wiring pattern and may be a wiring pattern in which, like the inductor 21B illustrated in FIGS. 5 and 6, a plurality of sub-wiring lines are connected in a bent state. At least a portion of the inductor 31B may have a wiring layer disposed in an inner layer of the substrate 50.

In this embodiment, furthermore, a harmonic termination circuit 20C includes the inductor 21A and the capacitor 22A that are arranged in a different manner from that of the inductors 21, 21A, and 21B and the capacitors 22 and 22A of the harmonic termination circuits 20, 20A, and 20B according to the first to fourth embodiments. That is, the first connection wiring line 54, the capacitor 22A, and the inductor 21A are connected in series with the connection pad 52 in this order. Since the heat dissipation effect of the inductor 31B of the output matching circuit 30B can be improved, the flexibility of arrangement of the harmonic termination circuit 20C can be increased. For example, the capacitor 22A can be disposed at a position closer to the amplifier circuit 10 than the inductor 21A.

The elements in the fifth embodiment may be combined with the elements in the first to third embodiments described above. That is, the power amplifier module 1E according to the fifth embodiment may include, in place of the harmonic termination circuit 20C, the harmonic termination circuit 20 having any other configuration, such as the harmonic termination circuit 20A illustrated in FIG. 4 or the harmonic termination circuit 20B illustrated in FIG. 5.

Sixth Embodiment

Figure 8:
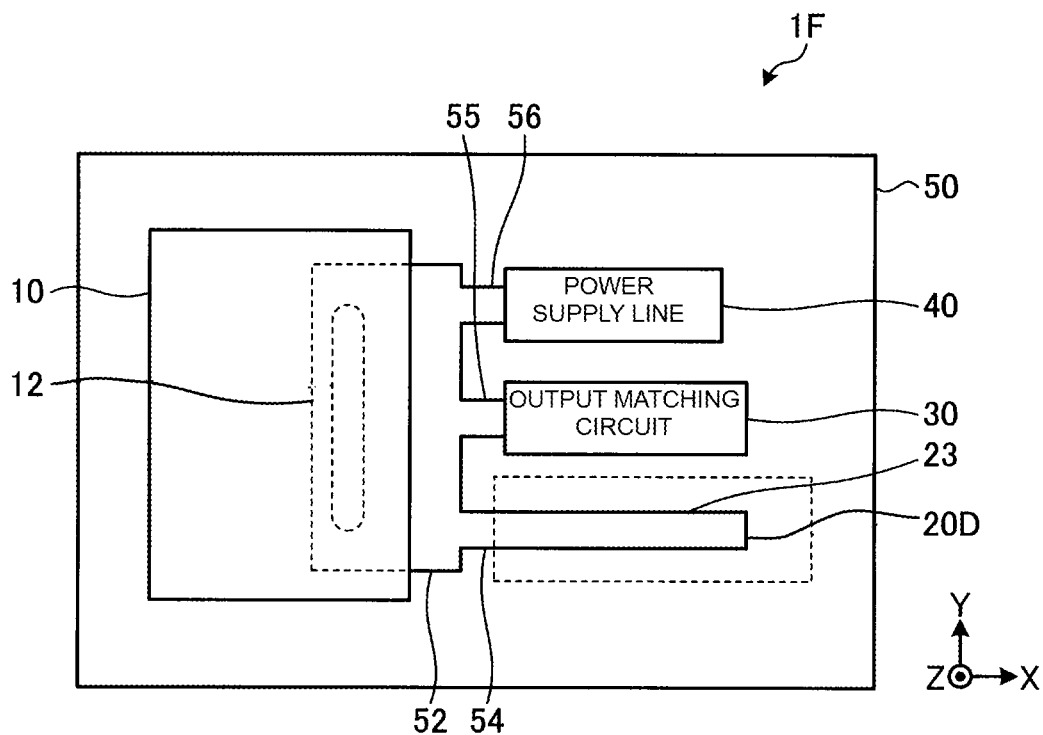
FIG. 8 is a schematic plan view of a power amplifier module according to a sixth embodiment.

FIG. 8 is a schematic plan view of a power amplifier module 1F according to a sixth embodiment. In the sixth embodiment, unlike the first to fifth embodiments described above, a harmonic termination circuit 20D includes an open stub 23, which is formed by a wiring line disposed on the substrate 50.

As illustrated in FIG. 8, in the power amplifier module 1F, the open stub 23 of the harmonic termination circuit 20D has an end connected to the connection pad 52 and another end open. The open stub 23 has a length L expressed by L=λ/4, where λ denotes the wave length of an nth-order harmonic. In this embodiment, the length L is not one quarter of the wave length in free space but one quarter of the wave length taking into account the wave-length shortening effect in the substrate 50. In this embodiment, the open stub 23 is formed by a wiring line, thus making it possible to simplify the configuration of the harmonic termination circuit 20D, compared with the embodiments described above.

The open stub 23 is formed by a wiring line common to the first connection wiring line 54. However, the open stub 23 may be a wiring line different from the first connection wiring line 54. In this case, the open stub 23 may be formed to have a different width from the width of the first connection wiring line 54 or may be formed in a layer different from that of the first connection wiring line 54.

The elements in the sixth embodiment may be combined with the elements in any one of the first embodiment, the fourth embodiment, and the fifth embodiment described above. That is, the power amplifier module 1F according to the sixth embodiment may include, in place of the output matching circuit 30, the output matching circuit 30 having any other configuration, such as the output matching circuit 30A illustrated in FIG. 6 or the output matching circuit 30B illustrated in FIG. 7.

The embodiments described above are intended to facilitate understanding of the present disclosure and are not to be construed as limiting the present disclosure. The present disclosure may be modified or improved without necessarily departing from the spirit thereof, and the present disclosure also includes equivalents thereof.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier module comprising:
a substrate;
an amplifier circuit comprising a plurality of transistors mounted on the substrate, and a bump connected to the plurality of transistors;
a harmonic termination circuit;
an output matching circuit, the harmonic termination circuit and the output matching circuit being in or on the substrate and electrically connected to the amplifier circuit;
a connection pad on the substrate and connected to the bump; and
a plurality of connection wiring lines branching from the connection pad, the plurality of connection wiring lines comprising a first connection wiring line that connects the connection pad to the harmonic termination circuit, a second connection wiring line that connects the connection pad to the output matching circuit, and a third connection wiring line that connects the connection pad to an external power supply,
wherein the first connecting wiring line, the second connecting wiring line, and the third connecting wiring line are respectively branched from the connection pad, and are electrically connected to the bump.

2. The power amplifier module according to claim 1, wherein, as seen in a plan view of the substrate in a direction perpendicular to a principal surface of the substrate, the connection pad has a larger area than the bump.

3. The power amplifier module according to claim 1, wherein at least one of the plurality of connection wiring lines comprises an intermediate wiring layer in an inner layer of the substrate.

4. The power amplifier module according to claim 1,
wherein the harmonic termination circuit comprises an inductor and a capacitor that are connected in series with each other, and
wherein the inductor and the capacitor are each a chip component mounted on the substrate.

5. The power amplifier module according to claim 1,
wherein the harmonic termination circuit comprises an inductor and a capacitor that are connected in series with each other,
wherein the inductor is formed by a wiring line in or on the substrate, and
wherein the capacitor is a chip component mounted on the substrate.

6. The power amplifier module according to claim 1, wherein the harmonic termination circuit comprises an open stub that is formed by a wiring line in or on the substrate.

7. The power amplifier module according to claim 1, wherein the output matching circuit comprises an inductor that is a chip component mounted on the substrate.

8. The power amplifier module according to claim 2, wherein at least one of the plurality of connection wiring lines comprises an intermediate wiring layer in an inner layer of the substrate.

9. The power amplifier module according to claim 2,
wherein the harmonic termination circuit comprises an inductor and a capacitor that are connected in series with each other, and
wherein the inductor and the capacitor are each a chip component mounted on the substrate.

10. The power amplifier module according to claim 3,
wherein the harmonic termination circuit comprises an inductor and a capacitor that are connected in series with each other, and
wherein the inductor and the capacitor are each a chip component mounted on the substrate.

11. The power amplifier module according to claim 2,
wherein the harmonic termination circuit comprises an inductor and a capacitor that are connected in series with each other,
wherein the inductor is formed by a wiring line in or on the substrate, and
wherein the capacitor is a chip component mounted on the substrate.

12. The power amplifier module according to claim 3,
wherein the harmonic termination circuit comprises an inductor and a capacitor that are connected in series with each other,
wherein the inductor is formed by a wiring line in or on the substrate, and
wherein the capacitor is a chip component mounted on the substrate.

13. The power amplifier module according to claim 2, wherein the harmonic termination circuit includes comprises an open stub that is formed by a wiring line disposed in or on the substrate.

14. The power amplifier module according to claim 3, wherein the harmonic termination circuit comprises an open stub that is formed by a wiring line disposed in or on the substrate.

15. The power amplifier module according to claim 5, wherein the output matching circuit comprises an inductor that is a chip component mounted on the substrate.

16. The power amplifier module according to claim 1, wherein the output matching circuit comprises an inductor that is formed by a wiring line in or on the substrate.

17. The power amplifier module according to claim 2, wherein the output matching circuit comprises an inductor that is formed by a wiring line in or on the substrate.

18. The power amplifier module according to claim 4, wherein the output matching circuit comprises an inductor that is formed by a wiring line in or on the substrate.

19. The power amplifier module according to claim 1, wherein the bump connects a collector of each of the plurality of transistors.

20. The power amplifier module according to claim 1, wherein the external power supply supplies a power supply voltage to a node between the bump and the output matching circuit via the third connection wiring line.

\* \* \* \* \*